(12) United States Patent
Shibata et al.

(10) Patent No.: US 8,289,432 B2
(45) Date of Patent: Oct. 16, 2012

(54) SOLID-STATE IMAGING APPARATUS

(75) Inventors: Masanori Shibata, Ayase (JP);
Masahiro Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 63 days.

(21) Appl. No.: 12/758,866

(22) Filed: Apr. 13, 2010

(65) Prior Publication Data
US 2010/0289931 A1    Nov. 18, 2010

(30) Foreign Application Priority Data

May 12, 2009 (JP) .................................. 2009-115932

(51) Int. Cl.
*H04N 3/14* (2006.01)
*H04N 5/335* (2006.01)
*H01L 27/00* (2006.01)

(52) U.S. Cl. ...................... 348/308; 348/294; 250/208.1

(58) Field of Classification Search .................. 348/294, 348/308, 300–302, 311–312; 341/122, 126, 341/155, 158, 166; 250/208.1; 257/290–294
See application file for complete search history.

(56) References Cited

U.S. PATENT DOCUMENTS

| 6,870,565 | B1 * | 3/2005 | Blerkom et al. | 348/294 |
| 7,462,810 | B2 | 12/2008 | Kobayashi et al. | 250/208.1 |
| 7,564,398 | B2 * | 7/2009 | Muramatsu et al. | 341/168 |
| 7,623,056 | B2 | 11/2009 | Yamashita | |
| 2005/0195304 | A1 * | 9/2005 | Nitta et al. | 348/308 |
| 2006/0103748 | A1 | 5/2006 | Mabuchi | 348/308 |
| 2007/0046795 | A1 | 3/2007 | Yamashita | 348/294 |
| 2008/0024630 | A1 * | 1/2008 | Hiyama et al. | 348/241 |
| 2008/0136948 | A1 * | 6/2008 | Muramatsu | 348/294 |
| 2008/0259164 | A1 * | 10/2008 | Taura | 348/207.1 |
| 2008/0278363 | A1 * | 11/2008 | Okumura | 341/155 |
| 2009/0009372 | A1 | 1/2009 | Yamashita | 341/122 |
| 2009/0303364 | A1 | 12/2009 | Shibata et al. | 348/302 |

FOREIGN PATENT DOCUMENTS

| JP | 05-048460 A | 2/1993 |
| JP | 2002-232291 * | 8/2002 |
| JP | 2002-232291 A | 8/2002 |
| WO | WO 2009/099003 A1 | 8/2009 |
| WO | WO 2009/119270 A1 | 10/2009 |

OTHER PUBLICATIONS

Chinese Office Action dated Dec. 7, 2011, in related Chinese Application No. 201010173423.5 (with English translation).

* cited by examiner

*Primary Examiner* — Nhan T Tran
*Assistant Examiner* — Tuan Le
(74) *Attorney, Agent, or Firm* — Fitzpatrick, Cella, Harper & Scinto

(57) ABSTRACT

A solid-state imaging apparatus includes a plurality of pixels and an A/D converter for converting analog image signals from the pixels into digital signals including a higher digit bit and a lower digit bit in time series. The A/D converter includes a first holding unit for holding the higher digit bit of the digital signal, a second holding unit for holding the lower digit bit of the digital signal, a third holding unit for holding the digital signal from the first holding unit, and a fourth holding unit for holding the digital signal from the second holding unit. A first pair including the first and third holding units, and a second pair including the second and fourth holding units are arranged in a direction along the column of the two-dimensional array of pixels.

8 Claims, 4 Drawing Sheets

SOLID-STATE IMAGING APPARATUS

BACKGROUND OF THE INVENTION

1. Field of the Invention

The present invention relates to a solid-state imaging apparatus.

2. Description of the Related Art

In recent years, the numbers of pixels of solid-state imaging apparatuses are being increased to enhance the quality of captured images in image input apparatuses such as digital still cameras and digital video cameras. Image input apparatuses are also available which reduce costs by mounting an A/D converter in a solid-state imaging apparatus to realize a digital output.

One example of an A/D conversion system mounted in a solid-state imaging apparatus is a column A/D conversion system (for example, see Japanese Patent Application Laid-Open No. H05-48460).

A column A/D conversion system includes an A/D converter for each column of pixels, and operates the A/D converters in parallel. Hence, the column A/D conversion system can enhance the readout speed of a solid-state imaging apparatus. Meanwhile, accompanying the miniaturization of pixels, there are severe limitations with respect to the arrangement of the A/D converters provided for each column of pixels. Examples of the configuration of a column A/D converter include a configuration that has a counter and ramp signal generation circuit both in common with another A/D converter, and also includes in each column, a comparator that compares a sensor signal and a ramp signal, and a holding unit that holds data from the counter when the comparator performs a comparison and determines a result. When the number of A/D conversion bits is increased to obtain a high image quality, an operation clock of the counter increases in speed proportionally to 2 to the power of natural number n.

To lower the speed of the operation clock, a method is available that employs a two-step A/D converter that converts higher digit bits and lower digit bits into digital signals in a time-series manner. Examples of a two-step A/D converter include a device disclosed in Japanese Patent Application Laid-Open No. 2002-232291.

Further, to increase the readout speed of a sensor mounted in a column A/D converter, a method is available that outputs A/D conversion data of the previous row during A/D conversion of sensor output of a certain row. To implement this, a holding unit that holds the conversion data of the previous row is required.

According to the A/D conversion system disclosed in the aforementioned Japanese Patent Application Laid-Open No. H05-48460, there is the problem that because the circuit diagram illustrates a circuit in which respective holding units for each bit are arranged in parallel in the direction along a row, the interval between the pixels increases when elements are disposed as shown in the circuit diagram.

Furthermore, the sizes of pixels decrease with the increase in the numbers of pixels of solid-state imaging apparatuses. Due to such increase in the number of pixels, in solid-state imaging apparatuses including column A/D converters in which an A/D converter is provided for each column of pixels, it is increasingly necessary to efficiently arrange circuit portions other than the pixel array that includes the A/D converters. However, neither Japanese Patent Application Laid-Open No. H05-48460 nor Japanese Patent Application Laid-Open No. 2002-232291 teaches or suggests anything regarding the arrangement of holding units that hold data from a counter. If a case is assumed in which the wires between A/D converters and holding units that hold conversion data of the relevant previous row are arranged in parallel in the row direction as shown in the circuit diagram shown in FIG. 8 in Japanese Patent Application Laid-Open No. H05-48460, there is the problem that the width between the holding units of each pixel column increases.

SUMMARY OF THE INVENTION

An object of the present invention is to provide a solid-state imaging apparatus that can reduce a pixel arrangement pitch.

In order to achieve the above object, the present invention provides a solid-state imaging apparatus comprising: a plurality of pixels, arranged in a two-dimensional array, for generating an analog image signal based on a photoelectric conversion; and an A/D converter arranged correspondingly to each column of the two-dimensional array of the pixels, for converting the analog image signal from the pixel into digital signal including an higher order bits and a lower order bits in time series, wherein the A/D converter includes a first holding unit for holding the higher order bits of the digital signal; a second holding unit for holding the lower order bits of the digital signal; a third holding unit for holding the digital signal from the first holding unit; and a fourth holding unit for holding the digital signal from the second holding unit, and wherein a first pair including the first and third holding units, and a second pair including the second and fourth holding units are arranged in a direction along the column of the two-dimensional array of the pixels.

The pixel arrangement pitch in the direction along rows of the two-dimensional array of pixels is easily reduced.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

(First Embodiment)

Figure 1:
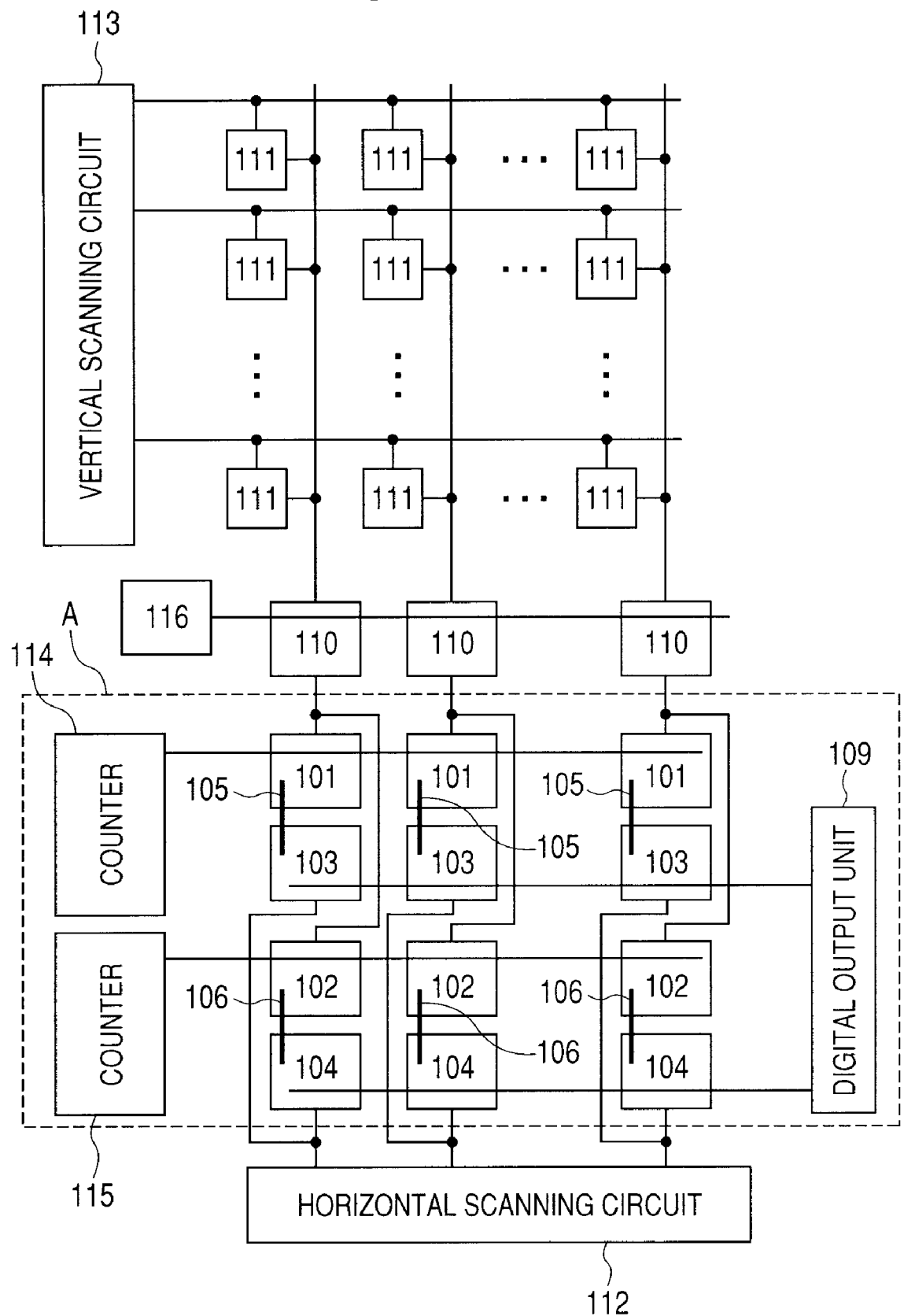
FIG. 1 is an overall configuration diagram of a solid-state imaging apparatus.

FIG. 1 is an overall configuration diagram of a solid-state imaging apparatus according to a first embodiment of the present invention. A plurality of pixels 111 having photoelectric conversion elements are arranged in a two-dimensional array. The photoelectric conversion elements are, for example, photodiodes that generate image signals by photoelectric conversion. A vertical scanning circuit 113 selects the pixels 111 row by row, and reads out analog signals generated in the selected pixels 111. The read-out signals are input to an A/D (analog/digital) converter that is provided for each column of pixels 111. The A/D converter converts the analog signals into digital signals. A comparator 110 included in the A/D converter compares the magnitude of a read-out signal and a comparison signal. Counters 114 and 115 are commonly provided for each column of pixels 111 to count a digital signal value. A first holding unit 101 is provided for each column of pixels 111, and holds a higher digit bit of a digital value of n bits that is output from the first counter 114. The data of the first holding unit 101 is sent to a third holding unit 103 through a first inter-holding unit line 105, and held at the third holding unit 103. A second holding unit 102 is provided for each column of pixels 111, and holds a lower digit bit of a digital value of n bits that is output from the second counter 115. The data of the second holding unit 102 is sent to a fourth holding unit 104 through a second inter-holding unit line 106, and held at the fourth holding unit 104. A horizontal scanning circuit 112 sequentially transfers data held in the third holding unit 103 and the fourth holding unit 104 to a digital output unit 109.

Next, operations including A/D conversion are described in detail. First, an output signal of the pixel 111 is compared at the comparator 110 with a first ramp signal generated at a reference signal generating circuit 116, and immediately after an inversion of a result of comparing the two signals, an output digital value of the first counter 114 is held in the first holding unit 101 as a higher digit bit. Simultaneously, the comparator 110 generates a difference signal between the output of the pixel 111 and the first ramp signal, and inputs the difference signal into the comparator 110. Next, the reference signal generating circuit 116 inputs into the comparator 110 a second ramp signal for which a change with respect to time in the signal level is of a smaller steepness in slope than that of the first ramp signal. The comparator 110 compares the second ramp signal and the difference signal. Immediately after an inversion of a result of comparing the two signals, the output digital value of the second counter 115 is held in the second holding unit 102 as a lower digit bit. As a result, digital conversion data based on the output analog signal of the pixel 111 is held in the first holding unit 101 and the second holding unit 102.

Thereafter, by switch control between the first holding unit 101 and the third holding unit 103, the data held in the first holding unit 101 is transferred to and held in the third holding unit 103 via the first inter-holding unit line 105. Simultaneously, by switch control between the second holding unit 102 and the fourth holding unit 104, the data held in the second holding unit 102 is transferred to and held in the fourth holding unit 104 via the second inter-holding unit line 106. Thereby, while output signals of the pixels 111 of the next row are converted into digital signals from analog signals and held in the first holding unit 101 and the second holding unit 102, the A/D conversion signals of the previous row can be output to a digital output unit 109 from the third holding unit 103 and the fourth holding unit 104.

Figure 2:
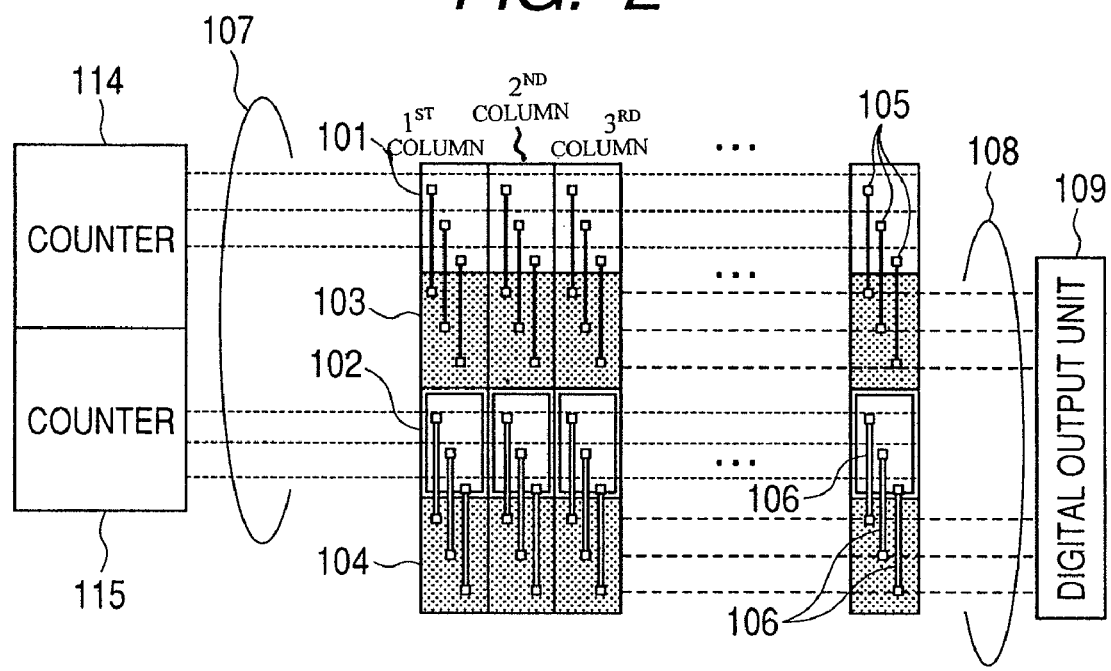
FIG. 2 is a layout diagram illustrating a solid-state imaging apparatus according to a first embodiment of the present invention.

FIG. 2 is a layout diagram that illustrates a first embodiment of a region A in the solid-state imaging apparatus shown in FIG. 1. The first counter 114 and second counter 115 that are common for each column in the array are disposed on the left side in the figure. The method adopted for arranging the holding units is one in which holding unit groups formed by arranging the first holding units 101 and third holding units 103 closely to each other in pairs, respectively, in the column direction, and holding unit groups formed by arranging the second holding units 102 and fourth holding units 104 closely to each other in pairs, respectively, in the column direction, are respectively arranged in the column direction.

Digital data from the first counter 114 is supplied to the first holding units 101 through a data line 107. Digital data from the second counter 115 is supplied to the second holding unit 102 through a data line 107. The digital data that is held at the first holding unit 101 is supplied to the third holding unit 103 through the first inter-holding unit line 105. The digital data that is held at the second holding unit 102 is supplied to the fourth holding unit 104 through the second inter-holding unit line 106. The digital data held at the third holding unit 103 and the fourth holding unit 104 is supplied to the digital output unit 109 through output lines 108.

In this connection, although data line 107 is illustrated as having six bits, the number of bits is not limited.

(Second Embodiment)

Figure 3:
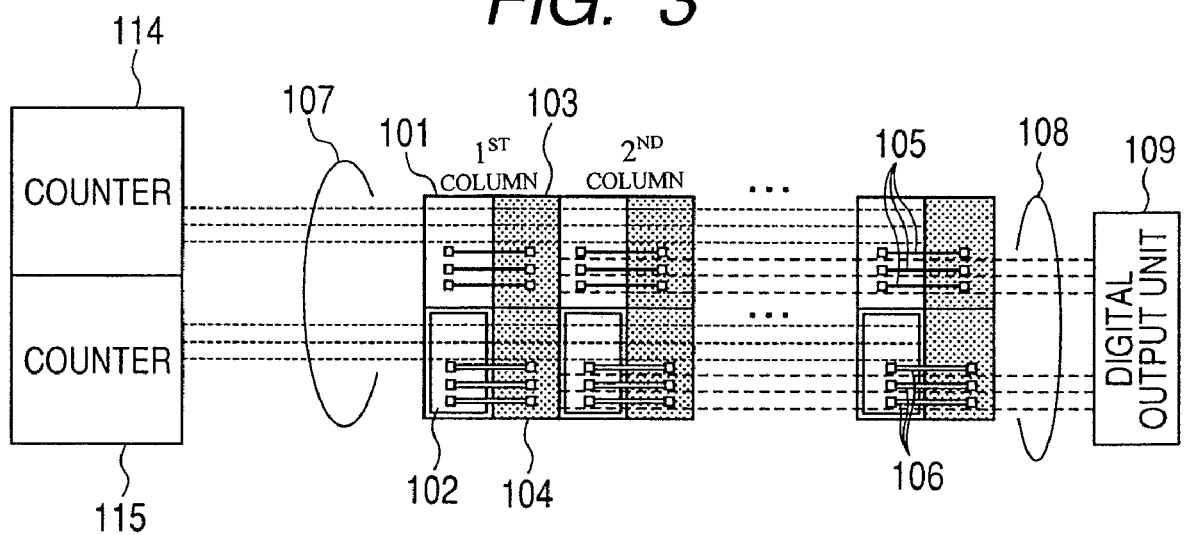
FIG. 3 is a layout diagram illustrating a solid-state imaging apparatus according to a second embodiment of the present invention.

FIG. 3 is a layout diagram illustrating a second embodiment of the region A in the solid-state imaging apparatus in FIG. 1. Components in FIG. 3 that are the same as those in FIG. 1 and FIG. 2 are denoted by the same reference numbers. Holding unit groups formed by arranging the first holding units 101 and third holding units 103 closely to each other in pairs, respectively, in the row direction, and holding unit groups formed by arranging the second holding units 102 and fourth holding units 104 closely to each other in pairs, respectively, in the row direction, are arranged in the column direction. The arrangement illustrated in FIG. 3 enables the length in the column-wise direction to be reduced with respect to the configuration illustrated in FIG. 2.

Digital data from the first counter 114 is supplied to the first holding unit 101 through data line 107. Digital data from the second counter 115 is supplied to the second holding unit group 102 through data line 107. The digital data held in the first holding unit 101 is supplied to the third holding unit 103 through the first inter-holding unit line 105. The digital data held in the second holding unit 102 is supplied to the fourth holding unit 104 through the second inter-holding unit line 106. The digital data held in the third holding unit 103 and the fourth holding unit 104 is supplied to the digital output unit 109 through output lines 108.

(Third Embodiment)

Figure 4:
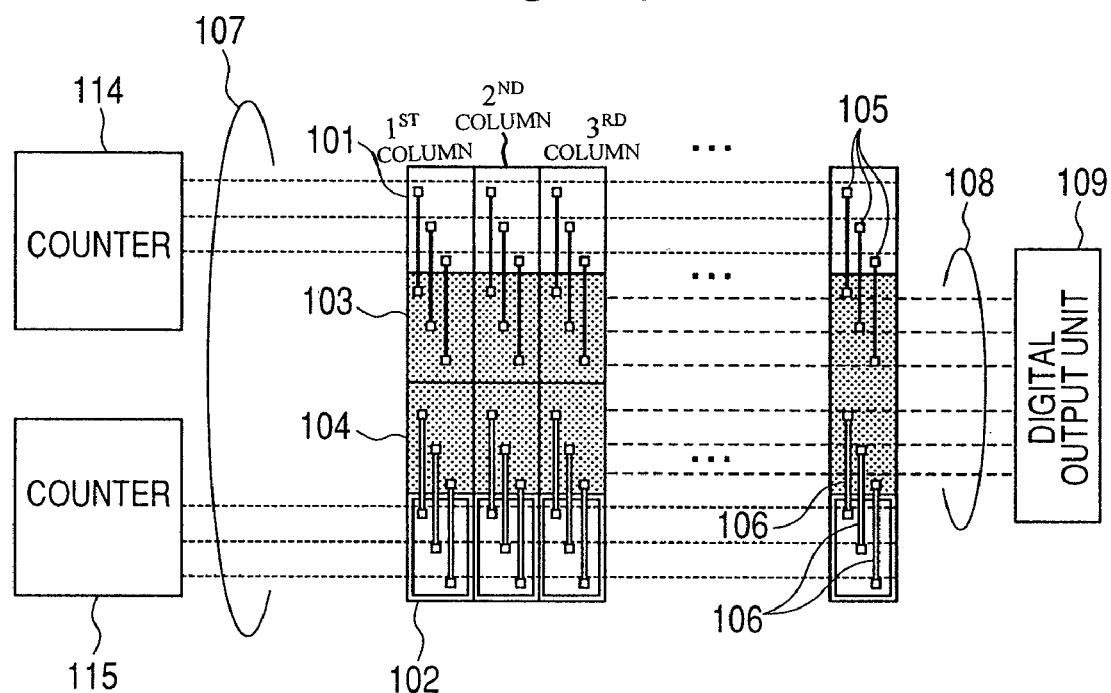
FIG. 4 is a layout diagram illustrating a solid-state imaging apparatus according to a third embodiment of the present invention.

FIG. 4 is a layout diagram illustrating a third embodiment of the region A in FIG. 1. Components in FIG. 4 that are the same as those in FIG. 1 and FIG. 2 are denoted by the same reference numbers. The difference between the present embodiment and the first embodiment is described hereafter. Similarly to FIG. 1, the first holding units 101 and the third holding units 103 are arranged closely to each other in the order of holding unit 101—holding unit 103 from the higher order bits. Conversely to the arrangement illustrated in FIG. 1, the second holding units 102 and the fourth holding units 104 are arranged closely to each other in the order of holding unit 104—holding unit 102 from the higher order bits. By adopting this arrangement, it is possible to concentrate the line of output lines 108, thus facilitating the arrangement. Further, it is possible to reduce the required area when implementing a measure to counter the effects of cross talk from output lines 108 to other elements.

Although in FIG. 4 the arrangement order of holding units when viewed from the pixel region is 101, 103, 104, and 102 from the top, it is possible to reverse the arrangement order of the holding units of the higher digit bit and lower digit bits. More specifically, the arrangement order of holding units may be 103, 101, 102, and 104. It is thereby possible to concentrate the line of data lines 107 from the counter, thus facilitating the arrangement.

(Fourth Embodiment)

Figure 5:
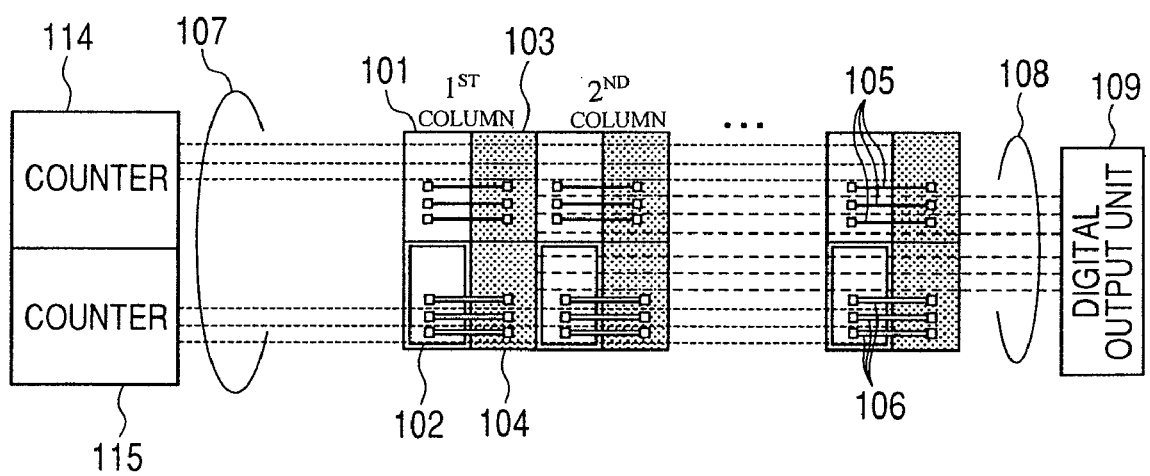
FIG. 5 is a layout diagram illustrating a solid-state imaging apparatus according to a fourth embodiment of the present invention.

FIG. 5 is a layout diagram illustrating a fourth embodiment of the region A in the solid-state imaging apparatus illustrated in FIG. 1. Components in FIG. 5 that are the same as those in FIG. 1 and FIG. 2 are denoted by the same reference numbers. The difference between the present embodiment and the second embodiment is described hereafter. Similarly to the arrangement in FIG. 3, holding unit groups formed by arranging the first holding units 101 and third holding units 103 closely to each other in pairs, respectively, in the row direction, and holding unit groups formed by arranging the second holding units 102 and fourth holding units 104 closely to each other in pairs, respectively, in the row direction, are arranged in the column direction. The difference with respect to FIG. 3 is the arrangement of the data lines 107 and output lines 108, which are connected in the order 107-108-108-107 in the column direction. By adopting this configuration, it is possible to concentrate the line of the output lines 108, thus facilitating the arrangement.

In this connection, if the arrangement of the data lines 107 and output lines 108 is reversed so that the data lines 107 and output lines 108 are connected in the order 108-107-107-108 in the column direction, it is possible to concentrate the line of the data lines 107, thus facilitating the arrangement.

Figure 6:
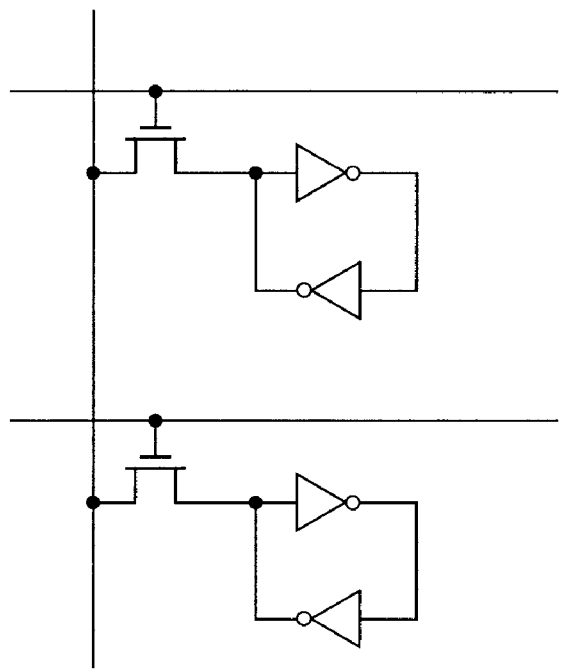
FIG. 6 is a view showing a configuration example of a holding unit.

In the solid-state imaging apparatuses according to the first to fourth embodiments, for the first to fourth holding units 101 to 104, capacitative elements may be used, or a configuration using a latch circuit may be used. FIG. 6 illustrates a configuration example using a latch circuit as the holding units 101 to 104.

FIG. 6 illustrates a configuration in which the holding unit groups of the paired first holding unit 101 and third holding unit 103 are arranged closely to each other in the direction along the columns, and the holding unit groups of the paired second holding unit 102 and fourth holding unit 104 are arranged closely to each other in the direction along the columns. The upper latch circuit is the holding unit 101 or 102, and the lower latch circuit is the holding unit 103 or 104. In this case, when a gate signal of the upper field-effect transistor is at a high level, the value output to the data line 107 from the counter 114 or 115 is held in the holding unit 101 or 102. Further, when the gate signal of the upper field-effect transistor and a gate signal of the lower field-effect transistor are at a high level, the data held in the holding unit 101 or 102 is transferred to the holding unit 103 or 104.

Figure 7:
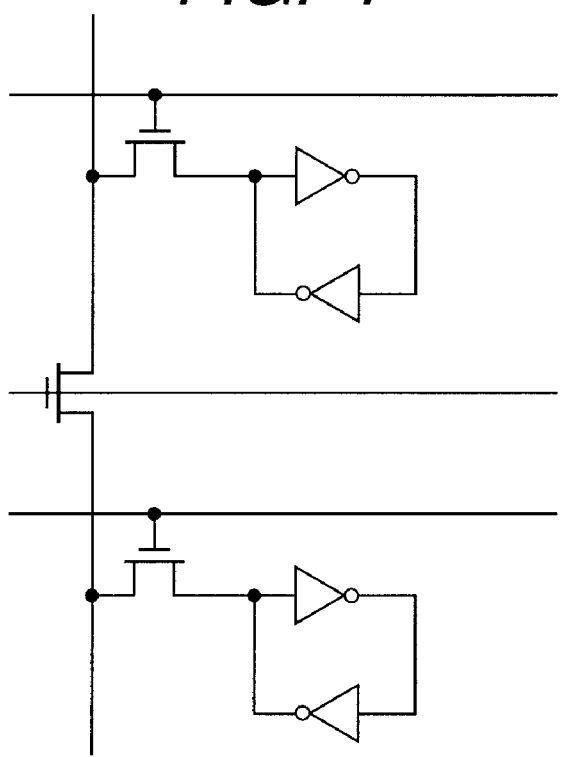
FIG. 7 is a view showing a configuration example of a holding unit.

FIG. 7 is a diagram illustrating another configuration example in which, relative to the configuration illustrated in FIG. 6, a switch is added between the first holding unit 101 and third holding unit 103, and a switch is added between the second holding unit 102 and fourth holding unit 104.

The first to fourth embodiments of the present invention have been described in the foregoing with reference to the drawings. However, the present invention is not limited to these embodiments, and the counters and digital output unit may be configured and arranged in a manner different to that described in the above embodiments. For example, although the higher digit counter 114 and lower digit counter 115 have been described as separate counters, the same counter may be used for both. Further, A/D conversion can be performed after amplifying the output of the pixels 111 for each column. It is also possible to reverse the arrangement order of each holding unit as viewed from the pixel region. Furthermore, it is possible to output signals of the pixels 111 in two directions, upper and lower, for alternate columns, and arrange an A/D conversion circuit and respective holding units and the like at the top and bottom of the photoelectric conversion elements region. More specifically, the signals from the pixels of odd columns may be transmitted to A/D conversion circuits arranged on one side of the photoelectric conversion elements region, and the signals from the pixels of even columns may be transmitted to A/D conversion circuits arranged on the other side of the photoelectric conversion elements region.

The solid-state imaging apparatuses of the first to fourth embodiments include a plurality of pixels 111 that are arranged in a two-dimensional array to generate an analog image signal based on photoelectric conversion and A/D (analog/digital) converters. An A/D converter is provided for each column of the two-dimensional array of pixels 111, and converts an analog image signal from the pixel 111 into a digital signal including a higher digit bit and a lower digit bit in time-series. The A/D converter includes the first holding unit 101, second holding unit 102, third holding unit 103, and fourth holding unit 104. Each first holding unit 101 holds the higher digit bit of a digital signal. Each second holding unit 102 holds the lower digit bit of a digital signal. Each third holding unit 103 holds a digital signal from the first holding unit 101. Each fourth holding unit 104 holds a digital signal from the second holding unit 102. A first pair including the first holding unit 101 and the third holding unit 103 and a second pair including the second holding unit 102 and the fourth holding unit 104 are arranged in a direction along the columns of the two-dimensional array of pixels 111.

The A/D converter also includes the counters 114 and 115 and the reference signal generating circuit 116. The counters 114 and 115 are commonly provided for each column of the two-dimensional array of pixels 111, and count digital signals. The reference signal generating circuit 116 generates first ramp signals and second ramp signals of different steepness in slopes, and is arranged commonly for the columns of the two-dimensional array of pixels 111. Analog image signals from the pixels 111 arranged in the two-dimensional array are input row by row into the A/D converters. For each column of pixels 111 arranged in the two-dimensional array, the A/D converter compares signals from the pixels 111 with a first ramp signal generated by the reference signal generating circuit 116. Subsequently, responsive to an inversion of a result of comparing a signal from the pixel 111 and the first ramp signal, the A/D converter holds the higher digit bits of digital signals supplied from the counters 114 and 115 in the first holding unit 101. The A/D converter holds a difference signal between the signal from the pixel 111 and a first ramp signal generated by the reference signal generating circuit 116. Thereafter, at a predetermined timing, the A/D converter compares the difference signal with a second ramp signal of a smaller steepness than that of the first ramp signal. Subsequently, responsive to an inversion of a result of comparing the difference signal and the second ramp signal, the A/D converter holds the lower digit bits of the digital signals supplied from the counters 114 and 115 in the second holding unit 102.

Further, according to FIG. 2, the first holding unit 101, the third holding unit 103, the second holding unit 102, and the fourth holding unit 104 are arranged abutting side by side in this order in a direction along the columns of the two-dimensional array of pixels 111.

According to FIG. 3, the first holding units 101 and third holding units 103 forming the first pairs are arranged abutting side by side in a direction along the rows of the two-dimensional array of pixels 111. Further, the second holding units 102 and fourth holding units 104 forming the second pairs are arranged abutting side by side in a direction along the rows of the two-dimensional array of pixels 111.

In the example illustrated in FIG. 4, the first holding units 101, the second holding units 102, the third holding units 103 and the fourth holding units 104 are arranged abutting side by side in a direction along the columns of the two-dimensional array of pixels 111 in the order of first holding unit 101, third holding unit 103, fourth holding unit 104, and second holding unit 102. Further, the first holding units 101, the second holding units 102, the third holding units 103 and the fourth holding units 104 are arranged abutting side by side in a direction along the columns of the two-dimensional array of pixels 111 in the order of third holding unit 103, first holding unit 101, second holding unit 102, and fourth holding unit 104.

In FIG. 5, the first holding units 101 and third holding units 103 forming the first pairs are arranged abutting side by side in a direction along the rows of the two-dimensional array of pixels 111. Further, the second holding units 102 and fourth holding units 104 forming the second pairs are arranged abutting side by side in a direction along the rows of the two-dimensional array of pixels 111. A first data line 107 connects the counter 114 and the first holding units 101. A second data line 107 connects the counter 115 and the second holding units 102. A first output line 108 outputs digital signals from the third holding units 103. A second output line 108 outputs digital signals from the fourth holding unit 104. The first data line 107, second data line 107, first output line 108, and second output line 108 are arranged in the order of first data line 107, first output line 108, second output line 108, and second data line 107. Further, a configuration may be adopted in which the first data line 107, second data line 107, first output line 108, and second output line 108 are arranged in the order of first output line 108, first data line 107, second data line 107, and second output line 108.

In the first to fourth embodiments, the A/D converter converts analog image signals that are input row by row from the two-dimensional array of pixels 111 into digital signals including higher digit bits and lower digit bits in time-series. While that A/D conversion is being performed, the A/D converter sequentially outputs digital signals obtained by performing analog/digital conversion of the previous row of the two-dimensional array of pixels 111 from the third holding unit 103 and fourth holding unit 104.

According to the first to fourth embodiments, it is easy to reduce the pixel arrangement pitch in a direction along the rows of a two-dimensional array of pixels in a solid-state imaging apparatus.

It should be understood that each of the above described embodiments merely illustrates a specific example for implementing the present invention, and the technical scope of the present invention is not limited by these embodiments. More specifically, the present invention may be implemented in various forms without departing from the technical idea or principal features of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-115932, filed May 12, 2009, which is hereby incorporated by reference herein in its entirety.

What is claimed is:

1. A solid-state imaging apparatus comprising:
   a plurality of pixels, arranged in a two-dimensional array, for generating an analog image signal based on photoelectric conversion; and
   an A/D converter arranged correspondingly to each column of the two-dimensional array of the pixels, for converting the analog image signal from the pixels into a digital signal including higher order bits and lower order bits in time series,
   wherein the A/D converter includes
   first and second counters for counting respectively the higher order bit and the lower order bits of the digital signal, arranged commonly for the columns of the two-dimensional array of the pixels;
   a first holding unit for holding the higher order bits of the digital signal received from the first counter through a first portion of data lines;
   a second holding unit for holding the lower order bits of the digital signal received from the second counter through a second, remaining portion of the data lines;
   a third holding unit for holding the digital signal from the first holding unit;
   a fourth holding unit for holding the digital signal from the second holding unit;
   a first output line for outputting the digital signal from the third holding unit;
   a second output line for outputting the digital signal from the fourth holding unit, wherein
   the first and second output lines are arranged between a line extending along the first portion of the data lines and a line extending along the second portion of the data lines.

2. The solid-state imaging apparatus according to claim 1, wherein
   the A/D converter includes;
   a reference signal generating circuit arranged commonly for the columns of the two-dimensional array of the pixels, for generating first and second ramp signals of different steepness in slopes, so that the A/D converter
   inputs row by row analog image signals from the pixels arranged in the two-dimensional array;
   compares, the analog image signals from the pixels with the first ramp signal generated by the reference signal generating circuit;
   holds, responsive to an inversion of a result of the comparing between the analog image signals and the first ramp signal, in the first holding unit, the higher order bits of the digital signal supplied from the first counter;
   holds a difference signal between the analog image signals and the first ramp signal;
   thereafter, at a predetermined timing, compares the difference signal with the second ramp signal of a smaller steepness than that of the first ramp signal; and
   responsive to an inversion of a result of the comparing between the difference signal and the second ramp signal, holds, in the second holding unit, the lower order bits of the digital signal supplied from the second counter.

3. The solid-state imaging apparatus according to claim 1, wherein
   the first holding unit, the third holding unit, the second holding unit, and the fourth holding unit are arranged abutting side by side in this order along a column direction of the two-dimensional array of the pixels.

4. The solid-state imaging apparatus according to claim 1, wherein
the first holding unit and the third holding unit forming a first pair are arranged abutting side by side along a row direction of the two-dimensional array of the pixels, and
the second holding unit and the fourth holding unit forming a second pair are arranged abutting side by side along the row direction of the two-dimensional array of the pixels.

5. The solid-state imaging apparatus according to claim 1, wherein
the first to fourth holding units are arranged abutting side by side in an order of the first holding unit, the third holding unit, the fourth holding unit and the second holding unit, or in an order of the third holding unit, the first holding unit, the second holding unit and the fourth holding unit, along a column direction of the two-dimensional array of the pixels.

6. The solid-state imaging apparatus according to claim 2, wherein
the first holding unit and the third holding unit forming a first pair are arranged abutting side by side along a row direction of the two-dimensional array of the pixels,
the second holding unit and the fourth holding unit forming a second pair are arranged abutting side by side along the row direction of the two-dimensional array of the pixels, and
the first and second portions of the data lines and the first and second output lines are arranged in an order of the first portion of the data lines, the first output line, the second output line and the second portion of the data lines, or in an order of the first output line, the first portion of the data lines, the second portion of the data lines and the second output line.

7. The solid-state imaging apparatus according to claim 1, wherein,
during converting row by row of the analog image signal from the pixel into the digital signal including the higher order bits and the lower order bits in time series, the A/D converter outputs sequentially, from the third and fourth holding units, digital signals converted by an A/D conversion from analog signals of a previous row of the two-dimensional array of the pixels.

8. The solid-state imaging apparatus according to claim 1, further comprising an output unit receiving the digital signal from the third and fourth holding units through the first and second output lines, wherein
the first to fourth holding units are arranged between the output unit and the first and second counters.

* * * * *